(12) United States Patent
Wang

(10) Patent No.: US 12,016,220 B2
(45) Date of Patent: Jun. 18, 2024

(54) STRETCHABLE DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Wenqiang Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 443 days.

(21) Appl. No.: 17/294,408

(22) PCT Filed: Mar. 19, 2021

(86) PCT No.: PCT/CN2021/081851
§ 371 (c)(1),
(2) Date: May 16, 2021

(87) PCT Pub. No.: WO2022/151582
PCT Pub. Date: Jul. 21, 2022

(65) Prior Publication Data
US 2022/0320223 A1    Oct. 6, 2022

(30) Foreign Application Priority Data

Jan. 12, 2021  (CN) .......................... 202110035743.2

(51) Int. Cl.
H10K 59/131    (2023.01)
H10K 77/10     (2023.01)
H10K 102/00    (2023.01)

(52) U.S. Cl.
CPC ......... H10K 59/131 (2023.02); H10K 77/111 (2023.02); *H10K 2102/311* (2023.02)

(58) Field of Classification Search
CPC ............... H10K 59/131; H10K 77/111; H10K 2102/311; H10K 59/10
See application file for complete search history.

(56) References Cited

U.S. PATENT DOCUMENTS 10,582,612 B2    3/2020  Kwon
2018/0052493 A1*  2/2018  Hong ..................... H10K 59/40
(Continued)

FOREIGN PATENT DOCUMENTS

CN    109599402 A    4/2019
CN    110444575 A    11/2019
(Continued)

*Primary Examiner* — Christine A Enad
(74) *Attorney, Agent, or Firm* — PV IP PC; Wei Te Chung; Zhigang Ma

(57) ABSTRACT

A stretchable display panel and a display device are provided. The stretchable display panel includes a center display area, a transition display area, and a wiring area, and in a direction from the center display area to the wiring area, a width of bridge structures in the transition display area gradually increases. Island structures located at a peripheral area include an edge bridge structure, and through meeting of adjacent edge bridge structures, a width of the edge bridge structures is increased to increase tensile strength of the edge bridge structures, decreasing risk of wires breaking in the transition display area.

20 Claims, 4 Drawing Sheets

(56) References Cited

U.S. PATENT DOCUMENTS

| | | | | |
|---|---|---|---|---|
| 2019/0311674 A1* | 10/2019 | Shin | .................... | G09G 3/3275 |
| 2020/0168824 A1* | 5/2020 | Park | .................... | H10K 77/111 |
| 2021/0225984 A1* | 7/2021 | Wang | .................... | H10K 71/00 |

FOREIGN PATENT DOCUMENTS

| | | |
|---|---|---|
| CN | 110718555 A | 1/2020 |
| CN | 111244133 A | 6/2020 |
| CN | 111326068 A | 6/2020 |
| CN | 111833753 A | 10/2020 |
| CN | 111834427 A | 10/2020 |
| CN | 111862815 A | 10/2020 |
| CN | 112002234 A | 11/2020 |
| KR | 20180072022 A | 6/2018 |

\* cited by examiner

STRETCHABLE DISPLAY PANEL AND DISPLAY DEVICE

CROSS-REFERENCE TO RELATED APPLICATIONS

This application is a 371 U.S. National Stage of International Application No. PCT/CN2021/081851, filed on Mar. 19, 2021, which claims priority to Chinese Application No. 202110035743.2, filed on Jan. 12, 2021. The entire disclosures of the above applications are incorporated herein by reference.

FIELD OF INVENTION

The present invention relates to the field of display technology and especially to a stretchable display panel and a display device.

BACKGROUND OF INVENTION

With development of flexible organic light emitting diode (OLED) display technology, foldable and rollable display terminal product consumer market gradually becomes mature. Innovations in foldable display technology make wide screen designs of cell phones, tablets, and notebooks, and display functions more diverse, and effects have a more satisfactory performance compared with liquid crystal display technology. On a basis of flexible OLED display technology, stretchable display technology will be a major research aspect of a next-generation display technology.

The essence of stretchable display technology is to realize flexibility of the screen. Through design of flexible display backplane, i.e., adopting a patterned design and hollowing out a backplane material, mechanical properties of the material are changed, making the display panel capable of being stretched in any direction with respect to its original area, thereby realizing stretchable and expandable display. Through this method, a variety of display shapes can be realized to adapt to various occasions and satisfy user requirements of environments. Stretchable display technology has broad application prospects in the fields of wearable, flexible medical equipment, and automotive display technologies.

SUMMARY OF INVENTION

However, realization of stretchable display technology mainly depends on mechanical performance of a display substrate. Module materials would necessarily have force exerted during a course of stretching, causing local deformation of various degrees in a display panel, thereby introducing a failure of the display substrate. Especially at a transition display area of a display area close to a wiring area, when a display backplane with island and bridge structures of a hollowing out design is under a state of stretching, because local stress is exerted, the island and bridge structures breaks more easily, causing various metal wires of this area to break, and leading to the display panel unable to be lit up.

In summary, conventional stretchable display panels have a problem that wires at an edge of a display area easily break. Therefore, it is necessary to provide a stretchable display panel and display device to deal with this drawback.

Embodiments of the present application provide a stretchable display panel and display device to solve a problem of conventional stretchable display panels that wires at an edge of a display area easily break.

Embodiments of the present application provide a stretchable display panel that includes a display area and a wiring area surrounding the display area, the display area includes a center display area and a transition display area located between the center display area and the wiring area, and the stretchable display panel further includes a plurality of island structures arranged in the display area in an array, wherein at least one pixel unit is disposed on each of the island structures; and a plurality of bridge structures, wherein each of the bridge structures is connected between adjacent two of the island structures, and a plurality of wires are disposed on the bridge structures; wherein in a direction from the center display area to the wiring area, a width of the bridge structures in the transition display area gradually increases, the island structures located at a peripheral area include at least one edge bridge structure configured to connect the island structures to the wiring area, and at least two adjacent edge bridge structures meet on one side of the transition display area close to the wiring area.

According to an embodiment of the present application, at least two adjacent island structures located at the peripheral area have a first opening defined therebetween, one second opening is defined on one side of each of the two adjacent island structures close to the wiring area, the first opening and the second opening define two adjacent edge bridge structures, and the two adjacent edge bridge structures meet between the two second openings.

According to an embodiment of the present application, the plurality of wires located on the two adjacent edge bridge structures meet between the two second openings through the edge bridge structures and are connected to the wiring area.

According to an embodiment of the present application, the transition display area is a circular area formed by a plurality of sides sequentially connected in a head-to-tail manner, the transition display area includes a middle area located at a middle of each of the sides, and the second openings are at least separately defined in the middle area.

According to an embodiment of the present application, a distance between two adjacent second openings is greater than or equal to a sum of widths of two edge bridge structures meeting between the two adjacent second openings.

According to an embodiment of the present application, an end of the first opening close to the wiring area extends to between the two adjacent second openings and does not exceed a virtual line joining sides of the two adjacent second openings close to the wiring area.

According to an embodiment of the present application, a length of a part of the first opening extending to between the two adjacent second openings is less than or equal to half of a distance between one side of the second openings close to the wiring area and one side of the second openings away from the wiring area.

According to an embodiment of the present application, the stretchable display panel includes a flexible substrate and a plurality of inorganic layers and organic layers stacked on the flexible substrate, and the second opening penetrates the inorganic layers, the organic layers, and the flexible substrate.

According to an embodiment of the present application, the transition display area includes a first sub-transition display area, a second sub-transition display area, and a third sub-transition display area sequentially surrounding the center display area, and a width of the bridge structures in the first sub-transition display area, a width of the bridge structures in the second sub-transition display area, and a width of the bridge structures in the third sub-transition display area progressively increase.

According to an embodiment of the present application, widths of the bridge structures in a same sub-transition display area are equal.

According to an embodiment of the present application, the bridge structures include a first end connected to one island structure and a second end connected to another island structure, the bridge structures in the first sub-transition display area and the bridge structures in the second sub-transition display area further include at least a first curved part connected to the first end and a second curved part connected to the second end, curvatures of the first curved part and of the second curved part located in the first sub-transition display area are greater than curvatures of the first curved part and of the second curved part located in the second sub-transition display area.

According to an embodiment of the present application, curvatures of the first curved part and of the second curved part located in a same sub-transition display area are equal.

According to an embodiment of the present application, the bridge structures in the third sub-transition display area further include a connection part connected to the first end and the second end, and the connection part is a straight line shape.

According to an embodiment of the present application, a ratio of a width of the transition display area to a width of the display area is between 3.9%-4.8%.

According to an embodiment of the present application, a center-to-center distance between any two adjacent island structures is equal.

Embodiments of the present application further provide a display device that includes a stretchable display panel, the stretchable display panel includes a display area and a wiring area surrounding the display area, the display area includes a center display area and a transition display area located between the center display area and the wiring area, and the stretchable display panel further includes a plurality of island structures arranged in the display area in an array, wherein at least one pixel unit is disposed on each of the island structures; and a plurality of bridge structures, wherein each of the bridge structures is connected between adjacent two of the island structures, and a plurality of wires are disposed on the bridge structures; wherein in a direction from the center display area to the wiring area, a width of the bridge structures in the transition display area gradually increases, the island structures located at a peripheral area include at least one edge bridge structure configured to connect the island structures to the wiring area, and at least two adjacent edge bridge structures meet on one side of the transition display area close to the wiring area.

According to an embodiment of the present application, at least two adjacent island structures located at the peripheral area have a first opening defined therebetween, one second opening is defined on one side of each of the two adjacent island structures close to the wiring area, the first opening and the second opening define two adjacent edge bridge structures, and the two adjacent edge bridge structures meet between the two second openings.

According to an embodiment of the present application, the plurality of wires located on the two adjacent edge bridge structures meet between the two second openings through the edge bridge structures and are connected to the wiring area.

According to an embodiment of the present application, the transition display area is a circular area formed by a plurality of sides sequentially connected in a head-to-tail manner, the transition display area includes a middle area located at a middle of each of the sides, and the second openings are at least separately defined in the middle area.

According to an embodiment of the present application, a distance between two adjacent second openings is greater than or equal to a sum of widths of two edge bridge structures meeting between the two adjacent second openings.

Beneficial effects of embodiments of the present disclosure are that embodiments of the present application provide a stretchable display panel and display device. The stretchable display panel includes a display area and a wiring area surrounding the display area, the display area includes a center display area and a transition display area located between the center display area and the wiring area, and the stretchable display panel further includes a plurality of island structures arranged in the display area in an array and a plurality of bridge structures, wherein at least one pixel unit is disposed on each of the island structures, each of the bridge structures is connected between adjacent two of the island structures, and a plurality of wires are disposed on the bridge structures, wherein in a direction from the center display area to the wiring area, a width of the bridge structures in the transition display area gradually increases. Tensile strength of the bridge structures is proportional to a width of the bridge structures, making tensile strength of the bridge structures in the transition display area gradually increase in a direction from the center display area to the wiring area, thereby while ensuring stretch performance of the display area, tensile strength and tensile resistance of the transition display area are also strengthened. The island structures located at a peripheral area include at least one edge bridge structure configured to connect the island structures to the wiring area, and at least two adjacent edge bridge structures meet on one side of the transition display area close to the wiring area. In this way, a width of the edge bridge structures is increased through meeting to increase tensile strength of the edge bridge structures, preventing the edge bridge structures from breaking due to local stress occurred on one side of the transition display area close to the wiring area, thereby decreasing risk of breaking of wires in the transition display area, mitigating a problem of the stretchable display panel that breaking of wires easily occurs at an edge of the display area, and increasing tensile resistance and lifetime of the stretchable display panel.

DESCRIPTION OF DRAWINGS

The accompanying figures to be used in the description of embodiments of the present application will be described in brief to more clearly illustrate the technical solutions of the embodiments. The accompanying figures described below are only part of the embodiments of the present application, from which figures those skilled in the art can derive further figures without making any inventive efforts.

DETAILED DESCRIPTION OF PREFERRED EMBODIMENTS

Figure 1:
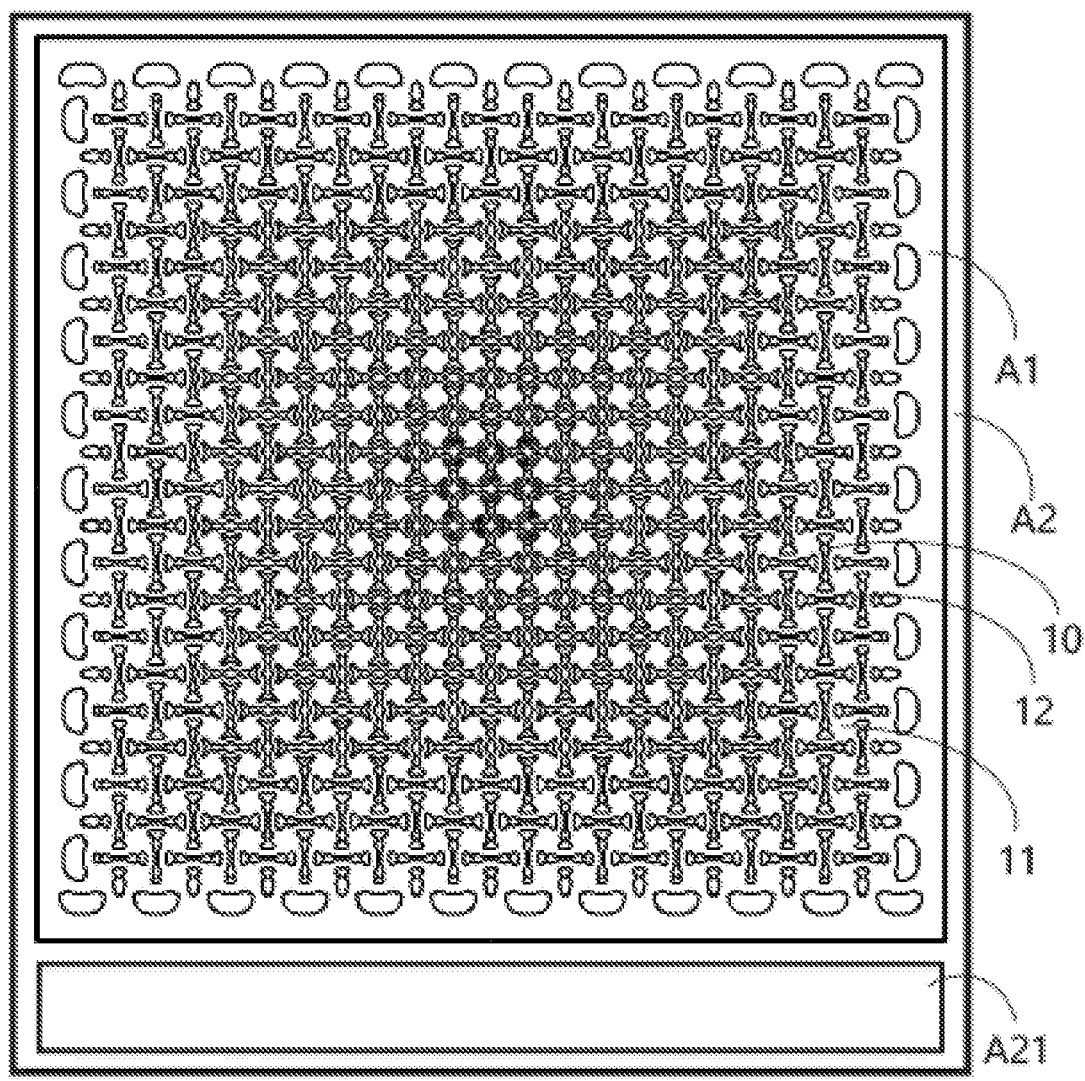
FIG. 1 is a structural schematic diagram of a stretchable display panel according to an embodiment of the present application.

Following description of various embodiments illustrates specific embodiments of the present disclosure with reference to accompanying drawings. Orientational terms mentioned in the present disclosure such as "top", "bottom", "front", "rear", "left", "right", "inside", "outside", "side", etc. merely indicate directions with respect to the accompanying drawings. Therefore, orientational terms are used to describe and for understanding the present disclosure, and not intended to limit the present disclosure. In the drawings, units of similar structures are denoted by same reference numerals.

The following further describes the present disclosure with reference to accompanying drawings and specific embodiments.

Embodiments of the present application provide a stretchable display panel, and the following describes in detail with reference to FIG. 1. Referring to FIG. 1, FIG. 1 is a structural schematic diagram of a stretchable display panel according to an embodiment of the present application. The stretchable display panel includes a display area A1 and a wiring area A2 surrounding the display area A1. The stretchable display panel further includes a plurality of island structures 11 and a plurality of bridge structures 12. The plurality of island structures 11 are arranged in the display area A1 in an array, at least one pixel unit is disposed on each of the island structures 11, each of the bridge structures 12 is connected between adjacent two of the island structures 11, and a plurality of wires are disposed on the bridge structures 12.

In an embodiment of the present application, referring to FIG. 1, a shape of the display area A1 is square. A plurality of hollowed out openings 10 are defined in the display area A1, the plurality of openings 10 define the plurality of island structures 11 and the plurality of bridge structures 12. Each of the island structures 11 is square, has an angle of 45° with respect to the horizontal direction, and is regularly arranged in an array on a plane where the display area A1 is located. Four sides of each of the island structures 11 are separately connected to one of the bridge structures 12. In applications, other island structure designs can be adopted according to requirements. It is not limited to the above-mentioned square, and can also be rectangular, circular, elliptic, rhombic, polygonal, etc. It can also have other angles with respect to the horizontal direction, such as 0°, which is also not limited.

The wiring area A2 is configured to accommodate various signal lines for transmission to the display area A1. A bonding area A21 is further disposed in the wiring area A2. A plurality of pads are disposed in the bonding area A21 and configured to bond to chip on film, a flexible circuit board, or a driving circuit chip.

In an embodiment of the present application, a pixel density of the stretchable display panel can reach 141 ppi, brightness of the stretchable display panel can be ensured to be basically unchanged when it is stretched by 5%, and it can also recover. In other embodiments, a pixel density of the stretchable display panel can also be higher than 141 ppi or lower than 141 ppi, and a center-to-center distance between adjacent island structures 11 has to be adjusted according to the pixel density. The pixel density of the stretchable display panel and the center-to-center distance between two adjacent island structures 11 can be decided according to real conditions and are not limited here.

It should be explained that FIG. 1 is schematic of structures and relative positions of the display area A1, the wiring area A2, and the openings 10, the island structures 11, and the bridge structures 12 located in the display area A1 according to an embodiment of the present application. Widths of the display area A1 and the wiring area A2 and numbers of the openings 10, the island structures 11, and the bridge structures 12 in the stretchable display panel shown in FIG. 1 do not represent widths of the display area A1 and the wiring area A2 and numbers of the openings 10, the island structures 11, and the bridge structures 12 in a stretchable display panel in real applications.

Figure 2:
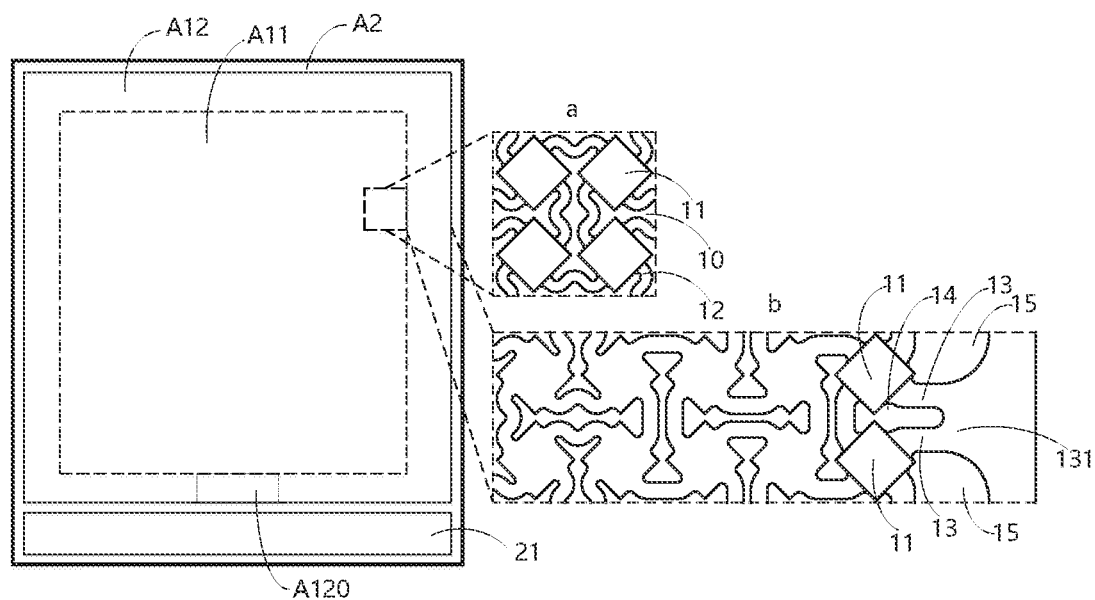
FIG. 2 is a layout schematic diagram of a display area according to an embodiment of the present application.

Referring to FIG. 2, FIG. 2 is a layout schematic diagram of a display area according to an embodiment of the present application. Wherein, part a is a partial enlargement schematic diagram of a center display area A11, and part b is a partial enlargement schematic diagram of a transition display area.

The display area A1 includes the center display area A11 and the transition display area A12 located between the center display area A11 and the wiring area A2. In a direction from the center display area A11 to the wiring area A2, a width of the bridge structures 12 in the transition display area A12 gradually increases. The island structures 11 located at a peripheral area include at least one edge bridge structure 13 configured to connect the island structures 11 to the wiring area A2, and at least two adjacent edge bridge structures 13 meet on one side of the transition display area A12 close to the wiring area A2.

It should be explained that FIG. 2 is schematic of structures and relative positions of the center display area A11 and the transition display area A12 included in the display area A1. Widths of the center display area A11 and the transition display area A12 in the stretchable display panel shown in FIG. 2 do not represent widths of the center display area A11 and the transition display area A12 in a stretchable display panel in real applications.

In an embodiment of the present application, referring to FIG. 2, two adjacent edge bridge structures 13 are separately formed between a first opening 14 and two adjacent second openings 15, and an area between the two adjacent second openings 15 where the two edge bridge structures 13 meet is defined as a second edge bridge structure 131. A width of the edge bridge structures 13 is a distance between the first opening 14 and the second opening 15, a width of the second edge bridge structure 131 is a distance between two adjacent second openings 15, and the width of the second edge bridge structure 131 is greater than a width of any one of the edge bridge structures 13. Tensile strength of the edge bridge structures 13 is proportional to the width of the edge bridge structures 13, tensile strength of the second edge bridge structure 131 is greater than a tensile strength of any one of the edge bridge structures 13 before meeting, and therefore through meeting of the two adjacent second openings 15 of the two adjacent edge bridge structures 13 close to the wiring area A2, the width of the edge bridge structures is increased, thereby increasing tensile strength of the edge bridge structures located at an edge of the transition display area A12 and configured to connect the island structures 11 to the wiring area A2.

Figure 3:
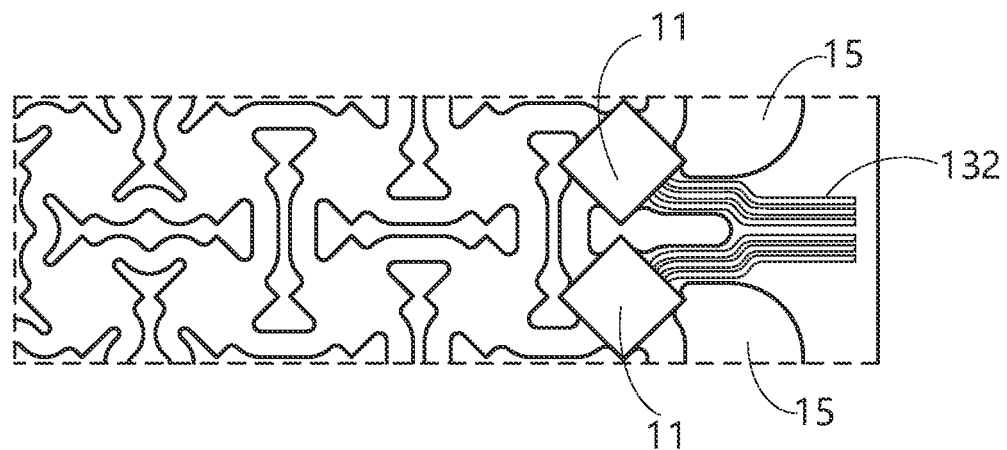
FIG. 3 is a wiring schematic diagram of a transition display area according to an embodiment of the present application.

Furthermore, referring to FIG. 2 and FIG. 3, FIG. 3 is a wiring schematic diagram of a transition display area according to an embodiment of the present application. The plurality of wires 132 on two adjacent edge bridge structures 13 are led out from two adjacent island structures 11 located at a peripheral area, and they meet between two second openings 15 through the edge bridge structures 13 and are connected to the wiring area A2. It can be understood that tensile strength of the edge bridge structures can be increased through meeting, decreasing risk of breaking when the edge bridge structures 13 are stretched, and risk of breaking of the wires 132 on the edge bridge structures 13 can also be decreased.

In an embodiment of the present application, the transition display area A12 is a circular area formed by a plurality of sides sequentially connected in a head-to-tail manner, the transition display area A12 includes a middle area A120 located at a middle of each of the sides, and the second openings 15 are at least separately defined in the middle area A120.

Optionally, the second openings 15 are only defined in the middle area A120 of each of the sides of the transition display area A12 (only one middle area A120 of one of the sides is shown in the figure). According to a stretchable display panel stretchability simulation, during a course of deformation, tensile stress is transmitted from the center display area A11 of the stretchable display panel to the transition display area A12. Under a condition of the stretchable display panel being stretched by 5%, the middle area A120 of each of the sides of the transition display area A12 is a stress concentration area, where local stress increases from the center display area A11 to the wiring area A2. Through defining the plurality of first openings 14 in the middle area A120 of each of the sides of the transition display area A12, rigidity of this area can be decreased, thereby mitigating local stress of this area. Meanwhile, the plurality of first openings 14 can also be used for meeting of adjacent edge bridge structures 13 on one side of the transition display area A12 close to the wiring area A2, thereby increasing tensile strength of the edge bridge structures, and decreasing risk of wires breaking on one side of the transition display area A12 close to the wiring area A2.

Preferably, referring to FIG. 1, the second openings 15 are defined at various places in the transition display area A12. It can be directly seen from FIG. 1 that the second openings 15 are defined at a peripheral area of the plurality of island structures 11 and surrounding the plurality of island structures 11. In this way, not only rigidity of various places in the transition display area A12 can be decreased, alleviating local stress of these areas, but tensile strength of edge bridge structures at various areas in the transition display area A12 can also be increased, thereby increasing tensile strength of an entire stretchable display panel.

Furthermore, a distance between two adjacent second openings 15 is greater than or equal to a sum of widths of two edge bridge structures 13 meeting between the two adjacent second openings 15.

In an embodiment of the present application, referring to FIG. 2, a distance between two adjacent second openings 15 is a width of the second edge bridge structure 131, which is greater than a sum of widths of two adjacent edge bridge structures 13 meeting between the two adjacent second openings 15. It can be understood that tensile strength of the edge bridge structures 13 is proportional to the width of the edge bridge structures 13, and therefore tensile strength of the second edge bridge structure 131 is greater than a sum of tensile strength of the two adjacent edge bridge structures 13, thereby further increasing tensile strength of the second edge bridge structure 131, decreasing risk of wires located on the second edge bridge structure 131 breaking, while ensuring space between adjacent wires would not be reduced when the wires on the two edge bridge structures 13 meet at the second edge bridge structure 131, thereby preventing mutual squeezing or short circuiting when the wires meet. In other embodiments, a distance between two adjacent second openings 15 can also be equal to a sum of widths of the two edge bridge structures 13 meeting between the two adjacent second openings 15.

Furthermore, an end of the first opening 14 close to the wiring area A2 extends to between two adjacent second openings 15, without exceeding a virtual line joining sides of the two adjacent second openings 15 close to the wiring area A2.

In an embodiment of the present application, referring to FIG. 2, the first opening 14 extends to a part between two adjacent second openings 15 and forms one edge bridge structure 13 with respect to each of the two second openings 15. An end of the first opening 14 close to the wiring area A2 does not exceed a virtual line joining sides of the two adjacent second openings 15 close to the wiring area A2 and does not meet the virtual line, thereby making a part between the two adjacent second openings 15 that is not overlapped with the first opening 14 be defined as the second edge bridge structure 131. Both an independent edge bridge structure 13 and a second edge bridge structure 131 defined by joining can provide one side of the transition display area 12 close to the wiring area A2 with a certain stretch performance. Meanwhile, with a wider second edge bridge structure 131 defined by meeting of the edge bridge structures 13, tensile strength of the edge bridge structures on one side of the transition display area A12 close to the wiring area A2 becomes greater, thereby decreasing risk of wires breaking on one side of the transition display area A12 close to the wiring area A2.

Preferably, a length of a part of the first opening 14 extending to between the two adjacent second openings 15 is less than or equal to half of a distance between one side of the second opening 15 close to the wiring area A2 and one side of the second opening 15 away from the wiring area A2. In this way, a length of the edge bridge structures 13 can be less than or equal to a length of the second edge bridge structure 131 as much as possible, and while a sufficient stretch performance of one side of the transition display area A12 close to the wiring area A2 is ensured, tensile strength of the side of the transition display area A12 close to the wiring area A2 can be increased as much as possible, thereby decreasing risk of wires breaking due to local stress on the side of the transition display area A12 close to the wiring area A2.

The transition display area A12 includes at least two sub-transition display areas sequentially surrounding the center display area A11. A width of the bridge structures 12 in a sub-transition display area close to the center display area A11 is less than a width of the bridge structures 12 in a sub-transition display area away from the center display area A12, and a width of bridge structures 12 in a same sub-transition display area is equal.

Figure 4:
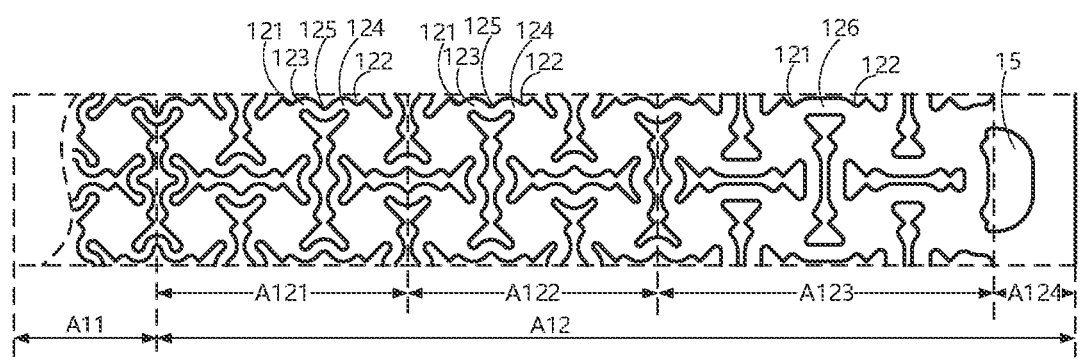
FIG. 4 is a layout schematic diagram of the transition display area according to an embodiment of the present application.
Figure 5:
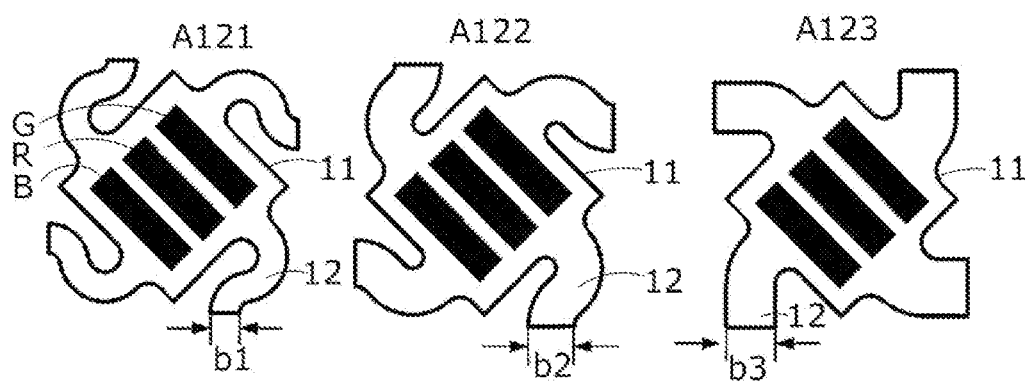
FIG. 5 is a schematic diagram of an island structure and a bridge structure in each sub-transition display area.

In an embodiment of the present application, referring to FIG. 4 and FIG. 5, FIG. 4 is a layout schematic diagram of a transition display area according to an embodiment of the present application, and FIG. 5 is a schematic diagram of an island structure and a bridge structure in each sub-transition display area. The transition display area A12 includes a first sub-transition display area A121, a second sub-transition display area A122, a third sub-transition display area A123, and an edge area A124 sequentially surrounding the center display area A11, and the second opening 15 is defined at the edge area A124. A width of bridge structures 12 in the first sub-transition display area A121 is less than a width of bridge structures 12 in the second sub-transition display area A122, the width of bridge structures 12 in the second sub-transition display area A122 is less than a width of bridge structures 12 in the third sub-transition display area A123, and a width of a plurality of bridge structures 12 in a same sub-transition display area is equal.

Specifically, a width b1 of each of the bridge structures 12 in the first sub-transition display area A121 is 15 μm, a width b2 of each of the bridge structures 12 in the second sub-transition display area A122 is 21 μm, and a width b3 of each of the bridge structures 12 in the third sub-transition display area A123 is 30 μm. It can be understood that tensile strength of the bridge structures 12 is directly proportional to the width of the bridge structures 12. In a direction from the center display area A11 to the wiring are A2, tensile strength of bridge structures 12 in the transition display area A12 increases stepwise, matching local stress in the transition display area A12 increasing in that direction. Meanwhile, the second opening 15 is disposed in the edge area A124. On the one hand, rigidity in the edge area A124 is therefore decreased, alleviating local stress in the edge area A124. On the other hand, tensile strength of edge bridge structures can also be increased, thereby preventing wires in this area from failure due to breakage from stretching force.

In other embodiments, a number of sub-transition display areas included in the transition display area A12 is not limited to three of the embodiment of the present application, it can also be two, three, or more than three. The number of sub-transition display areas included in the transition display area A12 can be decided according to real conditions and is not limited here.

In other embodiments, a width of each of the bridge structures 12 in the first sub-transition display area A121 can also be 15 μm, 17 μm, or 19 μm, etc., a width of each of the bridge structures 12 in the second sub-transition display area A122 can also be 23 μm, 24 μm, or 25 μm, etc., and a width of each of the bridge structures 12 in the third sub-transition display area A123 can also be 31 μm, 33 μm, or 35 μm, etc. Widths of the bridge structures 12 in each of the sub-transition display areas can be decided according to real conditions and are not limited here.

In other embodiments, in the direction from the center display area A11 to the wiring are A2, widths of bridge structures 12 located in a same sub-transition display area can also be in a trend of increasing, making tensile strength of bridge structures in the same sub-transition display area can also be in the trend of gradual increase, thereby making bridge structures 12 of various areas capable of bearing a corresponding stress.

The bridge structures 12 include a first end 121 connected to one island structure 11 and a second end 122 connected to another island structure 11. Bridge structures 12 in the first sub-transition display area A121 and those in the second sub-transition display area A122 further include at least a first curved part 123 connected to the first end 121 and a second curved part 124 connected to the second end 122. Curvatures of the first curved part 123 and of the second curved part 124 located in the first sub-transition display area A121 are greater than curvatures of the first curved part 123 and of the second curved part 124 located in the second sub-transition display area A122.

In an embodiment of the present application, referring to FIG. 4 and FIG. 5, the bridge structures 12 in the first sub-transition display area A121 and the bridge structures 12 in the second sub-transition display area A122 both include the first end 121, the second end 122, the first curved part 123, the second curved part 124, and a third curved part 125 connected to the first curved part 123 and the second curved part 124. The first end 121 is connected to a corresponding island structure 11, and two sides of where they are connected separately define one arc chamfer; the second end 122 is connected to another corresponding island structure 11, and two sides of where they are connected also separately form one arc chamfer.

Curvatures of the first curved part 123, of the second curved part 124, and of the third curved part 125 located in the first sub-transition display area A121 are greater than curvatures of the first curved part 123, of the second curved part 124, and of the third curved part 125 located in the second sub-transition display area A122. It can be understood that stretch performance of the curved parts is directly proportional to curvatures of the curved parts. Stretch performance of the first sub-transition display area A121 is better than stretch performance of the second sub-transition display area A122, making the first sub-transition display area A121 capable of bearing most of deformation in the transition display area A12. Tensile strength of the second sub-transition display area A122 is greater than that of the first sub-transition display area A121, while having a certain stretch performance, making the second sub-transition display area A122 capable not only of bearing part of the deformation in the transition display area A12, but also bearing part of local stress occurring in the transition display area A12. In this way, it is achieved that the deformation and the local stress in the transition display area A12 are evenly shared, thereby decreasing risk of wires breaking in the transition display area A12.

In an embodiment of the present application, in a same sub-transition display area, among each of the bridge structures 12, curvatures of the first curved part 123, the second curved part 124, and the third curved part 125 are equal. For each of the bridge structures 12, a curvature of the first curved part 123, a curvature of the second curved part 124, and a curvature of the third curved part 125 are equal. In other embodiments, in a direction from the center display area A11 to the wiring area A2, in a same sub-transition display area, for the bridge structures, curvatures of the first curved part 123, of the second curved part 124, and of the third curved part 125 can also be in a trend of decreasing.

Furthermore, referring to FIG. 4 and FIG. 5, in the third sub-transition display area A123, the bridge structures 12 include the first end 121 connected to one island structure 11, the second end 122 connected to another island structure 11, and a connection part 126 connected to the first end 121 and the second end, and the connection part 126 is a straight line shape. Bridge structures 12 in the third sub-transition display area A123 do not have a curved part, making tensile strength of the bridge structures 12 increase, and stretch performance decreases. In this way, they can bear local stress that mainly concentrates in the third sub-transition display area A123, thereby further decreasing risk of wires breaking in the transition display area Al2.

A ratio of a width of the transition display area A12 to a width of the display area A1 is between 3.9%-4.8%.

In an embodiment of the present application, the ratio of the width of the transition display area A12 to the width of the display area A1 is 4.8%, the width of the display area A1 is 125 mm, and the width of the transition display area A12 is 6mm. In other embodiments, the ratio of the width of the transition display area A12 to the width of the display area A1 can be 3.9%, and the width of the transition display area A12 is 4.9 mm. Alternatively, the ratio of the width of the transition display area A12 to the width of the display area A1 can also be 4.4%, and the width of the transition display area A12 is 5.5 mm. The width of the display area A1 and that of the transition display area Al2 can be decided according to real conditions and detailed description is omitted here.

Furthermore, in an embodiment of the present application, a width of the first sub-transition display area A121 is equal to a width of the second sub-transition display area A122 and greater than that of the third sub-transition display area A123. In this way, the first sub-transition display area A121 and the second sub-transition display area A122 can have greater stretch performance. With a greater rigidity of the third sub-transition display area A123, when the transition display area A12 is stretched, the first sub-transition display area A121 and the second sub-transition display area A122 can bear most of deformation, so that deformation of the third sub-transition display area A123 is decreased, thereby decreasing risk of wires breaking on one side of the transition display area A12 close to the wiring area A2.

Specifically, a ratio of the width of the first sub-transition display area A121 to the width of the transition display area A12 and a ratio of the width of the second sub-transition display area A122 to the width of the transition display area A12 are both 40%, and a ratio of a sum of widths of the third sub-transition display area A123 and of the edge area A124 to the width of the transition display area A12 is 20%.

In an embodiment of the present application, referring to FIG. 5, a pixel unit is disposed on each of the island structures 11, and the pixel unit includes a first sub-pixel G, a second sub-pixel B, and a third sub-pixel R. The first sub-pixel G is a green sub-pixel, the second sub-pixel B is a blue sub-pixel, the third sub-pixel R is a red sub-pixel, and the three sub-pixels are arranged parallel to sides of the island structure 11 and spaced apart. In other embodiments, two or more pixel units can also be disposed on each of the island structures 11. Each of the pixel units and each sub-pixel in the pixel units can be arranged according to conventional technology and it is not limited here.

In an embodiment of the present application, wires on the bridge structures 12 include but are not limited to data lines, gate lines, power voltage signal lines, etc. A hollowed-out design is not used in the bonding area A21, and various signal lines of the display area A1 gather at the bonding area A21 through the wiring area A2.

The stretchable display panel includes a flexible substrate 111 and a plurality of inorganic layers and organic layers stacked on the flexible substrate 111, and the second opening 15 penetrates the inorganic layers, the organic layers, and the flexible substrate 111.

Figure 6:
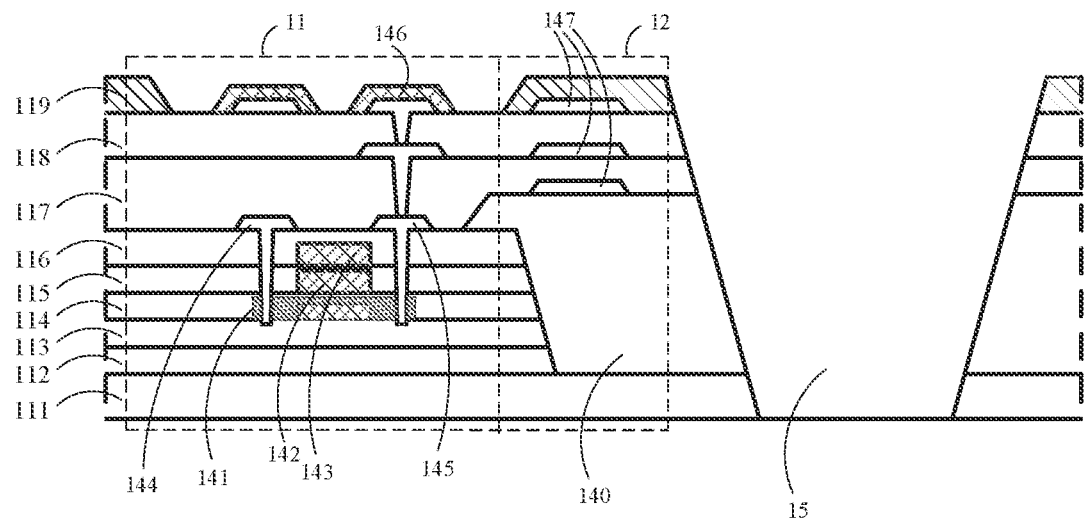
FIG. 6 is a stacking structural schematic diagram of film layers of the stretchable display panel according to an embodiment of the present application.

In an embodiment of the present application, referring to FIG. 6, FIG. 6 is a stacking structural schematic diagram of film layers of the stretchable display panel according to an embodiment of the present application. An area where the island structures 11 are located includes a first barrier layer 112, a second barrier layer 113, a first gate insulation layer 114, a second gate insulation layer 115, an interlayer dielectric layer 116, a first planarization layer 117, a second planarization layer 118, and a third planarization layer 119 sequentially stacked on the flexible substrate 111. An active layer 141 of a thin film transistor is formed on the first barrier layer 112, a first gate 142 is formed on the first gate insulation layer 114, a second gate 143 is formed on the second gate insulation layer 115, and a source 144 and a drain 145 are formed on the interlayer dielectric layer 116. A connection base 146 of a light-emitting diode is formed on the second planarization layer 118 and is connected to the drain 145 of the thin film transistor through a via hole.

An area where the bridge structures 12 are located includes an organic layer 140, the first planarization layer 117, the second planarization layer 118, and the third planarization 119 sequentially stacked on the flexible substrate111. A plurality of wires 147 on the first end 121 are separately formed on the organic layer 140, the first planarization layer 117, and the second planarization layer 118.

The second opening 15 sequentially penetrates the third planarization layer 119, the second planarization layer 118, the first planarization layer 117, the organic layer 140, and the flexible substrate 111.

The first barrier layer 112, the second barrier layer 113, the first gate insulation layer 114, the second gate insulation layer 115, and the interlayer dielectric layer 116 are all manufactured of inorganic materials, and the inorganic materials can be silicon nitride or silica. In this way, not only water vapor and oxygen can be barred from thin film transistors, but the island structures 11 can also have a certain rigidity and tensile resistance, preventing devices on the island structures 11 such as thin film transistors and light-emitting diodes from being damaged due to tensile stress during a course of stretching.

The first planarization layer 117, the second planarization layer 118, and the third planarization layer 119 are all manufactured of organic materials and are used to encapsulate and protect various wires in stacking structures of the stretchable display panel, and to decrease height differences of various inorganic layers occurred during stacking, improving flatness of an entire stacking structure of the stretchable display panel.

The connection base 146 of the light-emitting diode is a composite film layer made of molybdenum and copper.

It should be explained that FIG. 6 only shows film stacking structures at the edge area A124 of the stretchable display panel, and film stacking structures of the island structures 11 and the bridge structures 12 at the center display area A11 and the structures of each of the sub-transition display areas in the transition display area A12 are identical to film stacking structures of the island structures 11 and the bridge structures 12 at the edge area A124, and detailed description is omitted here. Openings 10 located in the center display area A11 and the transition display area A12, as well as first openings 14 located in the transition display area A12, also penetrate the third planarization layer 119, the second planarization layer 118, the first planarization layer 117, the organic layer 140, and the flexible substrate 111.

In an embodiment of the present application, a material of the flexible substrate 111 is polyimide, which can maintain satisfactory mechanical stability under a condition of 300 degrees Celsius and has satisfactory corrosion resistance and weather resistance. In this way, brightness of the display area can be ensured to remain basically unchanged when the entire stretchable display panel is stretched by 5%, and the stretchable display panel can resume to an original state.

In an embodiment of the present application, hollowed-out parts of the openings 10, the first opening 14, and the second opening 15 can be filled by stretchable viscoelastic materials such as optical cement, thereby improving screen flatness of the stretchable display panel after hollowing out.

Figure 7:
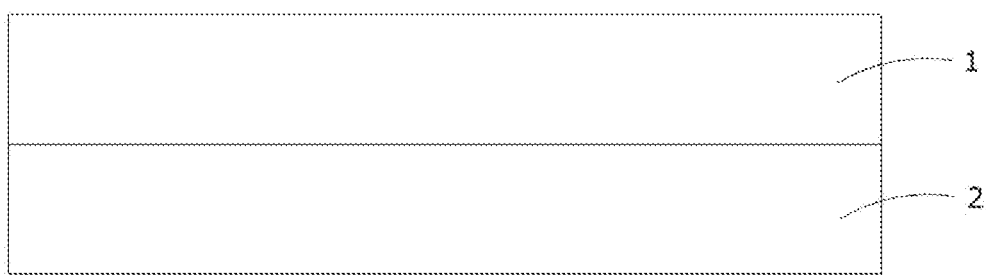
FIG. 7 is a structural schematic diagram of a display device according to an embodiment of the present application.

An embodiment of the present application further provides a display device. Referring to FIG. 7, FIG. 7 is a structural schematic diagram of a display device according to an embodiment of the present application. The display device includes a main body 2 and a stretchable display panel 1 disposed on the main body, and the main body 2 can include a housing component, a power component, a processor, a camera component, a microphone component, etc. The stretchable display panel 1 can be the stretchable display panel according to the above-described embodiments, the stretchable display panel 1 in the display device according to the embodiment of the present application can realize the same technical effects as the stretchable display panel according to the above-described embodiments does, and detailed description is omitted here. The display device can be a foldable cell phone, a rollable cell phone, a foldable notebook, a smartwatch, a vehicle display terminal, a flexible medical display terminal, etc.

In summary, embodiments of the present application provide a stretchable display panel and display device. The stretchable display panel includes a display area and a wiring area surrounding the display area, the display area includes a center display area and a transition display area located between the center display area and the wiring area, and the stretchable display panel further includes a plurality of island structures arranged in the display area in an array and a plurality of bridge structures, wherein at least one pixel unit is disposed on each of the island structures, each of the bridge structures is connected between adjacent two of the island structures, and a plurality of wires are disposed on the bridge structures, wherein in a direction from the center display area to the wiring area, a width of the bridge structures in the transition display area gradually increases. Tensile strength of the bridge structures is directly proportional to a width of the bridge structures, making tensile strength of the bridge structures in the transition display area gradually increase in a direction from the center display area to the wiring area, thereby ensuring stretch performance of the display area, while also strengthening tensile strength and tensile resistance of the transition display area. The island structures located at a peripheral area include at least one edge bridge structure configured to connect the island structures to the wiring area, and at least two adjacent edge bridge structures meet on one side of the transition display area close to the wiring area. In this way, a width of the edge bridge structures is increased through meeting to increase tensile strength of the edge bridge structures, preventing the edge bridge structures from breaking due to local stress occurring on one side of the transition display area close to the wiring area, thereby decreasing risk of wires breaking in the transition display area, mitigating a problem of the stretchable display panel that wire breakage easily occurs at an edge of the display area, and increasing tensile resistance and lifetime of the stretchable display panel.

In summary, although advantageous embodiments of the present applicating are disclosed above, the above-described advantageous embodiments are not intended to limit the present application. A person of ordinary skill in the art, without departing from sprit and scope of the present application, can make various changes and modifications, and therefore protection scope of the present application is based on what is claimed.

What is claimed is:

1. A stretchable display panel, comprising a display area and a wiring area surrounding the display area, wherein the display area comprises a center display area and a transition display area located between the center display area and the wiring area, and the stretchable display panel further comprises:
a plurality of island structures arranged in the display area in an array, wherein at least one pixel unit is disposed on each of the island structures; and
a plurality of bridge structures, wherein each of the bridge structures is connected between two adjacent island structures, and a plurality of wires are disposed on the bridge structures;
wherein in a direction from the center display area to the wiring area, a width of the bridge structures in the transition display area gradually increases, the island structures located at a peripheral area comprise at least one edge bridge structure configured to connect the island structures to the wiring area; and
wherein at least two adjacent island structures located at the peripheral area have a first opening defined therebetween, one second opening is defined on one side of each of the two adjacent island structures close to the wiring area, the first opening and two second openings define two adjacent edge bridge structures, and the two adjacent edge bridge structures meet between the two second openings.

2. The stretchable display panel as claimed in claim 1, wherein a shape of the second opening is different from a shape of the first opening.

3. The stretchable display panel as claimed in claim 1, wherein the plurality of wires located on the two adjacent edge bridge structures meet between the two second openings through the edge bridge structures and are connected to the wiring area.

4. The stretchable display panel as claimed in claim 1, wherein the transition display area is a circular area formed by a plurality of sides sequentially connected in a head-to-tail manner, the transition display area comprises a middle area located at a middle of each of the sides, and the second openings are at least separately defined in the middle area.

5. The stretchable display panel as claimed in claim 1, wherein a distance between two adjacent second openings is greater than or equal to a sum of widths of two edge bridge structures meeting between the two adjacent second openings.

6. The stretchable display panel as claimed in claim 5, wherein an end of the first opening close to the wiring area extends to between the two adjacent second openings and does not exceed a virtual line joining sides of the two adjacent second openings close to the wiring area.

7. The stretchable display panel as claimed in claim 6, wherein a length of a part of the first opening extending to between the two adjacent second openings is less than or equal to half of a distance between one side of the second openings close to the wiring area and one side of the second openings away from the wiring area.

8. The stretchable display panel as claimed in claim 1, wherein the stretchable display panel comprises a flexible substrate and a plurality of inorganic layers and organic layers stacked on the flexible substrate, and the second openings penetrate the inorganic layers, the organic layers, and the flexible substrate.

9. The stretchable display panel as claimed in claim 1, wherein the transition display area comprises a first sub-transition display area, a second sub-transition display area, and a third sub-transition display area sequentially surrounding the center display area, and a width of the bridge structures in the first sub-transition display area, a width of the bridge structures in the second sub-transition display area, and a width of the bridge structures in the third sub-transition display area gradually increase.

10. The stretchable display panel as claimed in claim 9, wherein widths of the bridge structures in a same sub-transition display area are equal.

11. The stretchable display panel as claimed in claim 9, wherein the bridge structures comprise a first end connected to one island structure and a second end connected to another island structure, the bridge structures in the first sub-transition display area and the bridge structures in the second sub-transition display area further comprise at least a first curved part connected to the first end and a second curved part connected to the second end, and curvatures of the first curved part and the second curved part located in the first sub-transition display area are greater than curvatures of the first curved part and of the second curved part located in the second sub-transition display area.

12. The stretchable display panel as claimed in claim 11, wherein curvatures of the first curved part and the second curved part located in a same sub-transition display area are equal.

13. The stretchable display panel as claimed in claim 11, wherein the bridge structures in the third sub-transition display area further comprise a connection part connected to the first end and the second end, and the connection part is a straight line shape.

14. The stretchable display panel as claimed in claim 1, wherein a ratio of a width of the transition display area to a width of the display area is between 3.9%-4.8%.

15. The stretchable display panel as claimed in claim 1, wherein a center-to-center distance between any two adjacent island structures is equal.

16. A display device, comprising a stretchable display panel, wherein the stretchable display panel comprises a display area and a wiring area surrounding the display area, the display area comprises a center display area and a transition display area located between the center display area and the wiring area, and the stretchable display panel further comprises:
  a plurality of island structures arranged in the display area in an array, wherein at least one pixel unit is disposed on each of the island structures; and
  a plurality of bridge structures, wherein each of the bridge structures is connected between two adjacent island structures, and a plurality of wires are disposed on the bridge structures;
  wherein in a direction from the center display area to the wiring area, a width of the bridge structures in the transition display area gradually increases, the island structures located at a peripheral area comprise at least one edge bridge structure configured to connect the island structures to the wiring area; and
  wherein at least two adjacent island structures located at the peripheral area have a first opening defined therebetween, one second opening is defined on one side of each of the two adjacent island structures close to the wiring area, the first opening and two second openings define two adjacent edge bridge structures, and the two adjacent edge bridge structures meet between the two second openings.

17. The display device as claimed in claim 16, wherein the plurality of wires located on the two adjacent edge bridge structures meet between the two second openings through the edge bridge structures and are connected to the wiring area.

18. The display device as claimed in claim 16, wherein the transition display area is a circular area formed by a plurality of sides sequentially connected in a head-to-tail manner, the transition display area comprises a middle area located at a middle of each of the sides, and the second openings are at least separately defined in the middle area.

19. The display device as claimed in claim 16, wherein a distance between two adjacent second openings is greater than or equal to a sum of widths of two edge bridge structures meeting between the two adjacent second openings.

20. A stretchable display panel, comprising a display area and a wiring area surrounding the display area, wherein the display area comprises a center display area and a transition display area located between the center display area and the wiring area, and the stretchable display panel further comprises:
  a plurality of island structures arranged in the display area in an array, wherein at least one pixel unit is disposed on each of the island structures; and
  a plurality of bridge structures, wherein each of the bridge structures is connected between two adjacent island structures, and a plurality of wires are disposed on the bridge structures;
  wherein in a direction from the center display area to the wiring area, a width of the bridge structures in the transition display area gradually increases, the island structures located at a peripheral area comprise at least one edge bridge structure configured to connect the island structures to the wiring area; and
  wherein at least two adjacent island structures located at the peripheral area have a first opening defined therebetween, one second opening is defined on one side of each of the two adjacent island structures close to the wiring area, the first opening and two second openings define two adjacent edge bridge structures, and the two adjacent edge bridge structures meet between the two second openings;
  wherein a distance between two adjacent second openings is greater than or equal to a sum of widths of two edge bridge structures meeting between the two adjacent second openings; and
  wherein an end of the first opening close to the wiring area extends to between the two adjacent second openings and does not exceed a virtual line joining sides of the two adjacent second openings close to the wiring area.

* * * * *